United States Patent
Jia et al.

(10) Patent No.: US 6,444,336 B1
(45) Date of Patent: Sep. 3, 2002

(54) THIN FILM DIELECTRIC COMPOSITE MATERIALS

(75) Inventors: Quanxi Jia; Brady J. Gibbons; Alp T. Findikoglu; Bae Ho Park, all of Los Alamos, NM (US)

(73) Assignee: The Regents of the University of California, Los Alamos, NM (US)

(*) Notice: Subject to any disclaimer, the term of this patent is extended or adjusted under 35 U.S.C. 154(b) by 47 days.

(21) Appl. No.: 09/747,212

(22) Filed: Dec. 21, 2000

(51) Int. Cl.⁷ .............................. B32B 9/00; C04B 35/01
(52) U.S. Cl. .................. 428/701; 428/689; 428/699; 428/469; 428/446; 428/688; 501/134; 501/137
(58) Field of Search ................................. 501/134, 137; 428/699, 689, 701, 688, 469, 446

(56) References Cited

U.S. PATENT DOCUMENTS

| | | |
|---|---|---|
| 5,166,759 A | 11/1992 | Ueno et al. |
| 5,312,790 A | 5/1994 | Sengupta et al. |
| 5,427,988 A | 6/1995 | Sengupta et al. |
| 5,486,491 A | 1/1996 | Sengupta et al. |
| 5,635,433 A | 6/1997 | Sengupta et al. |
| 5,635,434 A | 6/1997 | Sengupta |
| 5,693,429 A | 12/1997 | Sengupta et al. |
| 5,830,591 A | 11/1998 | Sengupta et al. |
| 5,846,893 A | 12/1998 | Sengupta et al. |

FOREIGN PATENT DOCUMENTS

| | | | |
|---|---|---|---|
| JP | 61-185810 | * | 8/1986 |
| JP | 61-256922 | * | 11/1986 |
| JP | 62-222514 | * | 9/1987 |
| JP | 62-252007 | * | 11/1987 |

OTHER PUBLICATIONS

Im et al., "Composition–Control of Magnetron–Sputter–Deposited $(Ba_xSr_{1-x})Ti_{1+y}O_{3+z}$ Thin Films for Voltage Tunable Devices," Applied Physics Letters, vol. 76, No. 5, pp. 625–627, Jan. 31, 2000.

Cole et al., "Mg–doped $Ba_{0.6}Sr_{0.4}TiO_3$ Thin Films for Tunable Microwave Applications," Applied Physics Letters, vol. 77, No. 2, Jul. 10, 2000.

* cited by examiner

*Primary Examiner*—Deborah Jones
*Assistant Examiner*—A B Sperty
(74) *Attorney, Agent, or Firm*—Bruce H. Cottrell

(57) ABSTRACT

A dielectric composite material comprising at least two crystal phases of different components with $TiO_2$ as a first component and a material selected from the group consisting of $Ba_{1-x}Sr_xTiO_3$ where x is from 0.3 to 0.7, $Pb_{1-x}Ca_xTiO_3$ where x is from 0.4 to 0.7, $Sr_{1-x}Pb_xTiO_3$ where x is from 0.2 to 0.4, $Ba_{1-x}Cd_xTiO_3$ where x is from 0.02 to 0.1, $BaTi_{1-x}Zr_xO_3$ where x is from 0.2 to 0.3, $BaTi_{1-x}Sn_xO_3$ where x is from 0.15 to 0.3, $BaTi_{1-x}Hf_xO_3$ where x is from 0.24 to 0.3, $Pb_{1-1.3x}La_xTiO_{3+0.2x}$ where x is from 0.23 to 0.3, $(BaTiO_3)_x(PbFe_{0.5}Nb_{0.5}O_3)_{1-x}$ where x is from 0.75 to 0.9, $(PbTiO_3)_x(PbCo_{0.5}W_{0.5}O_3)_{1-x}$ where x is from 0.1 to 0.45, $(PbTiO_3)_x(PbMg_{0.5}W_{0.5}O_3)_{1-x}$ where x is from 0.2 to 0.4, and $(PbTiO_3)_x(PbFe_{0.5}Ta_{0.5}O_3)_{1-x}$ where x is from 0 to 0.2, as the second component is described. The dielectric composite material can be formed as a thin film upon suitable substrates.

20 Claims, 5 Drawing Sheets

THIN FILM DIELECTRIC COMPOSITE MATERIALS

The present invention relates to dielectric composite materials and more particularly to thin film dielectric composite materials. This invention was made with government support under Contract No. W-7405-ENG-36 awarded by the U.S. Department of Energy. The government has certain rights in the invention.

FIELD OF THE INVENTION

BACKGROUND OF THE INVENTION

Materials with a high, nonlinear dielectric constant have been found to be very beneficial when used for microelectronic applications in the radio frequency and/or microwave frequency regime. Materials that have been widely investigated for these applications include strontium titanate ($SrTiO_3$), barium strontium titanate ($BA_{1-x}Sr_xTiO_3$ also referred to as BSTO), lead calcium titanate ($Pb_{1-x}Ca_xTiO_3$), and the like.

By far the most widely investigated materials for electrically tunable microwave devices are $Ba_{1-x}Sr_xTiO_3$. The operation temperature of the devices is largely determined by the ratio of Ba to Sr. These materials however exhibit a high dielectric loss which is undesirable for high performance microwave devices. For practical dc electrically tunable microwave devices (such as voltage tunable filters and phase shifters), it is desirable to have nonlinear dielectric materials that have as large a dielectric tunability and as low a dielectric loss as possible. The existing efforts to reduce the dielectric loss include adding dopants such as tungsten, manganese, and/or calcium into $Ba_{1-x}Sr_xTiO_3$. Other dopants have also been introduced into BSTO materials in an attempt to improve the material properties that are directly related to device performance. For example, U.S. Pat. Nos. 5,312,790, 5,427,988, 5,486,491, 5,635,433, 5,635,434, 5,693,429, 5,830,591 and 5,846,893 describe BSTO composites including additives or dopants such as magnesium oxide, aluminum oxide, zinc oxide, zirconium oxide, magnesium zirconate, magnesium aluminate, or magnesium titanate. Nevertheless, the existing approaches all suffer from the reduction of the dielectric constant and the dielectric tunability. In the latter case, the dielectric constant for these oxides is typically 10–20. The dielectric constant of solid solution $Ba_{1-x}Sr_xTiO_3$ varies due to composition and temperature, but is typically over 100. Therefore, depending upon the method of mixing and the quantity of dopant, the dielectric constant of composite materials is expected to decrease significantly.

A number of references have discussed altering the ratio of Ti to (Ba+Sr). For example, fin et al., Appi. Phys. Lett., vol. 76, no. 5, pp. 625–627 (2000) describe films with controlled compositions of Ti to (Ba+Sr) grown from a stoichiometric $Ba_{0.5}Sr_{0.55}TiO_3$ target.

The common expectation of adding $TiO_2$ to $Ba_{1-x}Sr_xTiO_3$ is that a single Ti-rich compound $Ba_{1-x}Sr_xTi_{1+y}O_3$ phase will form. In contrast, the present inventors have now discovered that addition of $TiO_2$ to $Ba_{1-x}Sr_xTiO_3$ can form a two phase composite material even under high temperature processing conditions. In other words, the resultant material maintains separated phases of $TiO_2$ and $Ba_{1-x}Sr_xTiO_3$. This surprising observation led to the development of the present invention that shows many advantages compared to existing technologies.

One object of the present invention is to provide dielectric composite materials including two distinct material phases.

Another object of the present invention is to provide thin film dielectric composite materials including two distinct material phases.

A further object of this invention is to provide epitaxial and/or amorphous, polycrystalline, nanocrystalline thin film dielectric composite materials including two distinct material phases.

Yet another object of this invention is to provide dielectric composite materials having lower dielectric loss and adjustable dielectric tunability.

Yet another object of this invention is to provide dielectric composite materials having a low dielectric loss and an adjustable dielectric constant.

SUMMARY OF THE INVENTION

To achieve the foregoing and other objects, and in accordance with the purposes of the present invention, as embodied and broadly described herein, the present invention provides a dielectric composite material including at least two crystal phases of different components with $TiO_2$ as a first component and a material selected from the group consisting of $Ba_{1-x}Sr_xTiO_3$ where x is from 0.3 to 0.7, $Pb_{1-x}Ca_xTiO_3$ where x is from 0.4 to 0.7, $Sr_{1-x}Pb_xTiO_3$ where x is from 0.2 to 0.4, $Ba_{1-x}Cd_xTiO_3$ where x is from 0.02 to 0.1, $BaTi_{1-x}Zr_xO_3$ where x is from 0.2 to 0.3, $BaTi_{1-x}Sn_xO_3$ where x is from 0.15 to 0.3, $BaTi_{1-x}Hf_xO_3$ where x is from 0.24 to 0.3, $Pb_{1-1.3x}La_xTiO_{3+0.2x}$ where x is 0.3, $(BaTiO_3)_x(PbFe_{0.5}Nb_{0.5}O_3)_{1-x}$ where x is from 0.75 to 0.9, $(PbTiO_3)_x(PbC_{0.5}W_{0.5}O_3)_{1-x}$ where x is from 0.1 to 0.45, $(PbTiO_3)_x(PbMg_{0.5}W_{0.5}O_3)_{1-x}$ where x is from 0.2 to 0.4, and $(PbTiO_3)_x(PbFe_{0.5}Ta_{0.5}O_3)_{1-x}$ where x is from 0 to 0.2, as the second component.

In another embodiment, the present invention provides a dielectric composite material including at least two crystal phases of different components, formed at high temperatures from $TiO_2$ and a material selected from the group consisting of $Ba_{1-x}Sr_xTiO_3$ where x is from 0.3 to 0.7, $Pb_{1-x}Ca_xTiO_3$ where x is from 0.4 to 0.7, $Sr_{1-x}Pb_xTiO_3$ where x is from 0.2 to 0.4, $Ba_{1-x}Cd_xTiO_3$ where x is from 0.02 to 0.1, $BaTi_{1-x}Zr_xO_3$ where x is from 0.2 to 0.3, $BaTi_{1-x}Sn_xO_3$ where x is from 0.15 to 0.3, $BaTi_{1-x}Hf_xO_3$ where x is from 0.24 to 0.3, $Pb_{1-1.3x}La_xTiO_{3+0.2x}$ where x is from 0.23 to 0.3, $(BaTiO_3)_x(PbFe_{0.5}Nb_{0.5}O_3)_{1-x}$ where x is from 0.75 to 0.9, $(PbTiO_3)_x(PbCo_{0.5}W_{0.5}O_3)_{1-x}$ where x is from 0.1 to 0.45, $(PbTiO_3)_x(PbMg_{0.5}W_{0.5}O_3)_{1-x}$ where x is from 0.2 to 0.4, and $(PbTiO_3)_x(PbFe_{0.5}Ta_{0.53})_{1-x}$ where x is from 0 to 0.2.

The present invention also provides a process of forming a thin film dielectric composite material including at least two crystal phases of different components with $TiO_2$ as a first component and a material selected from the group consisting of $Ba_{1-x}Sr_xTiO_3$ where x is from 0.3 to 0.7, $Pb_{1-x}Ca_xTiO_3$ where x is from 0.4 to 0.7, $Sr_{1-x}Pb_xTiO_3$ where x is from 0.2 to 0.4, $Ba_{1-x}Cd_xTiO_3$ where x is from 0.02 to 0.1, $BaTi_{1-x}Zr_xO_3$ where x is from 0.2 to 0.3, $BaTi_{1-x}Sn_xO_3$ where x is from 0.15 to 0.3, $BaTi_{1-x}Hf_xO_3$ where x is from 0.24 to 0.3, $Pb_{1-1.3x}La_xTiO_{3+0.2x}$ where x is from 0.23 to 0.3, $(BaTiO_3)_x(PbFe_{0.5}Nb_{0.5}O_3)_{1-x}$ where x is from 0.75 to 0.9, $(PbTiO_3)_x(PbCo_{0.5}W_{0.5}O_3)_{1-x}$ where x is from 0.1 to 0.45, $(PbTiO_3)_x(PbMg_{0.5}W_{0.5}O_3)_{1-x}$ where x is from 0.2 to 0.4, and $(PbTiO_3)_x(PbFe_{0.5}Ta_{0.5}O_3)_{1-x}$ where x is from 0 to 0.2, as the second component including the steps of forming a starting material including a mixture of $TiO_2$ and the material selected from the group consisting of $Ba_{1-x}Sr_xTiO_3$, $Pb_{1-x}Ca_xTiO_3$, $Sr_{1-x}Pb_xTiO_3$, $Ba_{1-x}Cd_xTiO_3$, $BaTi_{1-x}Zr_xO_3$, $BaTi_{1-x}Sn_xO_3$, $BaTi_{1-x}Hf_xO_3$, $Pb_{1-1.3x}La_xTiO_{3+0.2x}$, $(BaTiO_3)_x(PbFe_{0.5}Nb_{0.5}O_3)_{1-x}$, $(PbTiO_3)_x(PbMg_{0.5}W_{0.5}O_3)_{1-x}$, and $(PbTiO_3)_x$ $(PbFe0.5Ta_{0.5}O_3)_{1-x}$, depositing a thin film of the starting material on a substrate and heating the thin film of starting material for time and at temperatures sufficient to form said thin film dielectric composite material including at least two crystal phases of different components.

DETAILED DESCRIPTION

Figure 1:
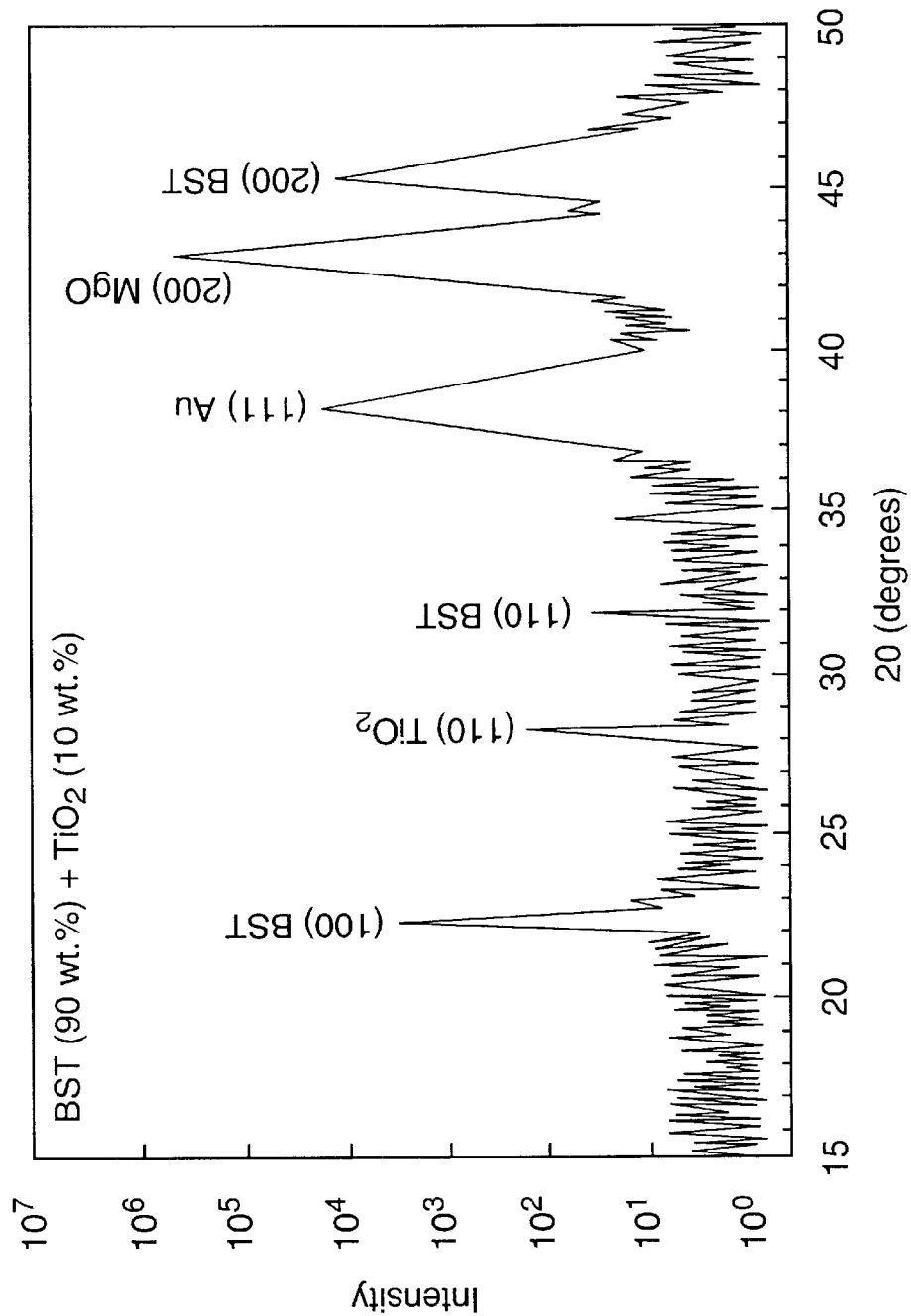
FIG. 1 is a graph plotting a X-ray diffraction scan of a 90 percent by weight BSTO/10 percent by weight $TiO_2$ composite on a MgO substrate in accordance with an embodiment of the present invention.

The present invention concerns thin film and/or ceramic composites that can be used for radio frequency and microwave frequency components. This invention provides an effective approach to control the dielectric constant, the dielectric tunability, and the dielectric loss of the materials.

Thin film and/or ceramic composites for radio frequency and microwave frequency components have been designed and fabricated. These components can be resonators, filters, phase shifters and the like. The operating temperature of the system can be altered based on the exact chemical compositions of the composites. Compared to the commonly used dielectric materials, the composite materials developed here have the advantages of lower dielectric loss (while maintaining a significantly adjustable dielectric constant) and desirable capacitance tunability.

The composites in the present invention include combinations of titanium dioxide ($TiO_2$) and a material such $Ba_{1-x}Sr_xTiO_3$, $Pb_{1-x}Ca_xTiO_3$, $Sr_{1-x}Pb_xTiO_3$, $Ba_{1-x}Cd_xTiO_3$, $BaTi_{1-x}Zr_xO_3$, $BaTi_{1-x}Sn_xO_3$, $BaTi_{1-x}Hf_xO_3$, $Pb_{1-1.3x}La_xTiO_{3+0.2x}$, $(BaTiO_3)_x(PbFe_{0.5}Nb_{0.5}O_3)_{1-x}$, $(PbTiO_3)_x(PbCo_{0.5}W_{0.5}O_3)_{1-x}$, $(PbTiO_3)_x(PbMg_{0.5}W_{0.5}O_3)_{1-x}$, and $(PbTiO_3)_x(PbFe_{0.5}Ta_{0.5}O_3)_{1-x}$. For the applications of the present invention when $Ba_{1-x}Sr_xTiO_3$ is combined with the $TiO_2$, x is generally from about 0.3 to 0.7 so as to provide an operating temperature range above the Curie temperature of the material. For the other materials the ranges of x is generally as follows so as to provide an operating temperature range above the Curie temperature of the material: for $Pb_{1-x}Ca_xTiO_3$ x is from 0.4 to 0.7; for $Sr_{1-x}Pb_xTiO_3$ x is from 0.2 to 0.4; for $Ba_{1-x}Cd_xTiO_3$ x is from 0.02 to 0.1; for $BaTi_{1-x}Zr_xO_3$ x is from 0.2 to 0.3; for $BaTi_{1-x}Sn_xO_3$ x is from 0.15 to 0.3; for $BaTi_{1-x}Hf_xO_3$ x is from 0.24 to 0.3; for $Pb_{1-1.3x}La_xTiO_{3+0.2x}$ x is from 0.23 to 0.3; for $(BaTiO_3)_x(PbFe_{0.5}Nb_{0.5}O_3)_{1-x}$ x is from 0.75 to 0.9; for $(PbTiO_3)_x(PbCo_{0.5}W_{0.5}O_3)_{1-x}$ x is from 0.1 to 0.45; for $(PbTiO_3)_x(PbMg_{0.5}W_{0.5}O_3)_{1-x}$ x is from 0.2 to 0.4; and, for $(PbTiO_3)_x(PbFe_{0.5}Ta_{0.5}O_3)_{1-x}$ x is from 0 to 0.2. The present composite materials can serve as room temperature tunable dielectric materials.

In certain applications of the present invention such as for use as a tunable dielectric material, the composite material is preferably epitaxial as that will improve the tunability as is well known to those skilled in the art. The term "epitaxial" generally refers to a material having an oriented crystalline arrangement. Suitable substrate materials for epitaxial films include lanthanum aluminum oxide ($LaAlO_3$), magnesium oxide (MgO), neodymium gadolinium oxide ($NdGaO_3$), $Sr_2AlTaO_6$, or $(LaAlO_3)_{0.3}(Sr_2AlTaO_6)_{0.7}$. The substrate materials can be single crystal materials, e.g., a $Y_2O_3$ single crystal, a $SrTiO_3$ single crystal, a $LaGaO_3$ single crystal, an $Al_2O_3$ single crystal and a $ZrO_2$ single crystal.

In other applications of the present invention such as for use as a capacitor material, the composite material can be amorphous, polycrystalline or nanocrystalline as that may facilitate processing as is well known to those skilled in the art. Suitable substrate materials for amorphous, polycrystalline or nanocrystalline films can include a semiconductor material such as a silicon-based material, i.e., a bulk silicon substrate, a silicon germanium substrate, a silicon on insulator (SOI) substrate and the like, an insulator material such as sapphire and the like, or a metal or metal alloy such as steel and the like.

Thin film dielectric composite materials can be deposited by pulsed laser deposition or by other well known methods such as evaporation, sputtering, or chemical vapor deposition such as MOCVD. Other conventional processing techniques can be used for bulk articles and thick films. For example, standard tape casting techniques can be used for thick films of several microns in thickness.

The two phase systems of the present invention can be formed in high temperature processes including, e.g., pulsed laser deposition and the like. By "high temperature" is generally meant temperatures from about 500° C. to about 950° C. although higher temperatures can be employed in some instances. Despite such high temperatures, two phases, e.g., two crystalline phases of the composite material can be obtained.

In pulsed laser deposition, powder of the desired materials, e.g., $TiO_2$ and $Ba_{1-x}Sr_xTiO_3$ can be initially pressed into a disk or pellet under high pressure, generally above about 500 pounds per square inch (PSI) and the pressed disk then sintered in an oxygen-containing atmosphere for at least about one hour, preferably from about 12 to 24 hours. An apparatus suitable for the pulsed laser deposition is shown in Appl. Phys. Lett., 56, 578(1990), "Effects of beam parameters on excimer laser deposition of $YBa_2Cu_3O_{7-x}$", such description hereby incorporated by reference.

Suitable conditions for pulsed laser deposition include, e.g., the laser, such as a XeCl excimer laser (20 nanoseconds (ns), 308 nanometers (nm)) a KrF laser (248 nm), or an ArF laser (193 nm), targeted upon a rotating pellet of the desired material at an incident angle of about 45°. The substrate can be mounted upon a heated holder rotated at about 0.5 revolutions per minute (rpm) to minimize thickness variations in the resultant film or layer. The substrate can be heated during the deposition at temperatures from about 500° C. to about 950° C., preferably from about 700° C. to about 850° C. An oxygen atmosphere of from about 0.1 millitorr (mTorr) to about 500 mTorr, preferably from about 100 mTorr to about 250 mTorr, can be maintained within the deposition chamber during the deposition. Distance between the substrate holder and the pellet can generally be from about 4 centimeters (cm) to about 10 cm.

The rate of formation of thin films or layers can be varied from about 0.1 Angstrom per second (Å/s) to about 200 Å/s by changing the laser repetition rate from about 1 hertz (Hz) to about 200 Hz. As laser beam divergence is a function of the repetition rate, the beam profile can be monitored after any change in repetition rate and the lens focal distance adjusted to maintain a constant laser energy density upon the target pellet. Generally, the laser beam can have dimensions of about 3 millimeters (mm) by 4 mm with an average energy density of from about 1 to about 5 joules per square centimeter ($J/cm^2$), preferably from about 1.5 to about 3 $J/cm^2$.

The dielectric composite materials of the present invention can be formed as ceramics or as thin films. The dielectric composite materials of the present invention are preferably formed as thin films for both tunable dielectric applications and for capacitor applications. In tunable microwave applications, the thin films of the dielectric composite are generally from about 2000 Angstroms to about 2 microns in thickness, more preferably from about 3000 Angstroms to about 1 micron in thickness. In capacitor applications, the thin films of the dielectric composite are generally less than about 1000 Angstroms thickness, preferably from about 200 Angstroms to about 500 Angstroms in thickness.

Figure 2:
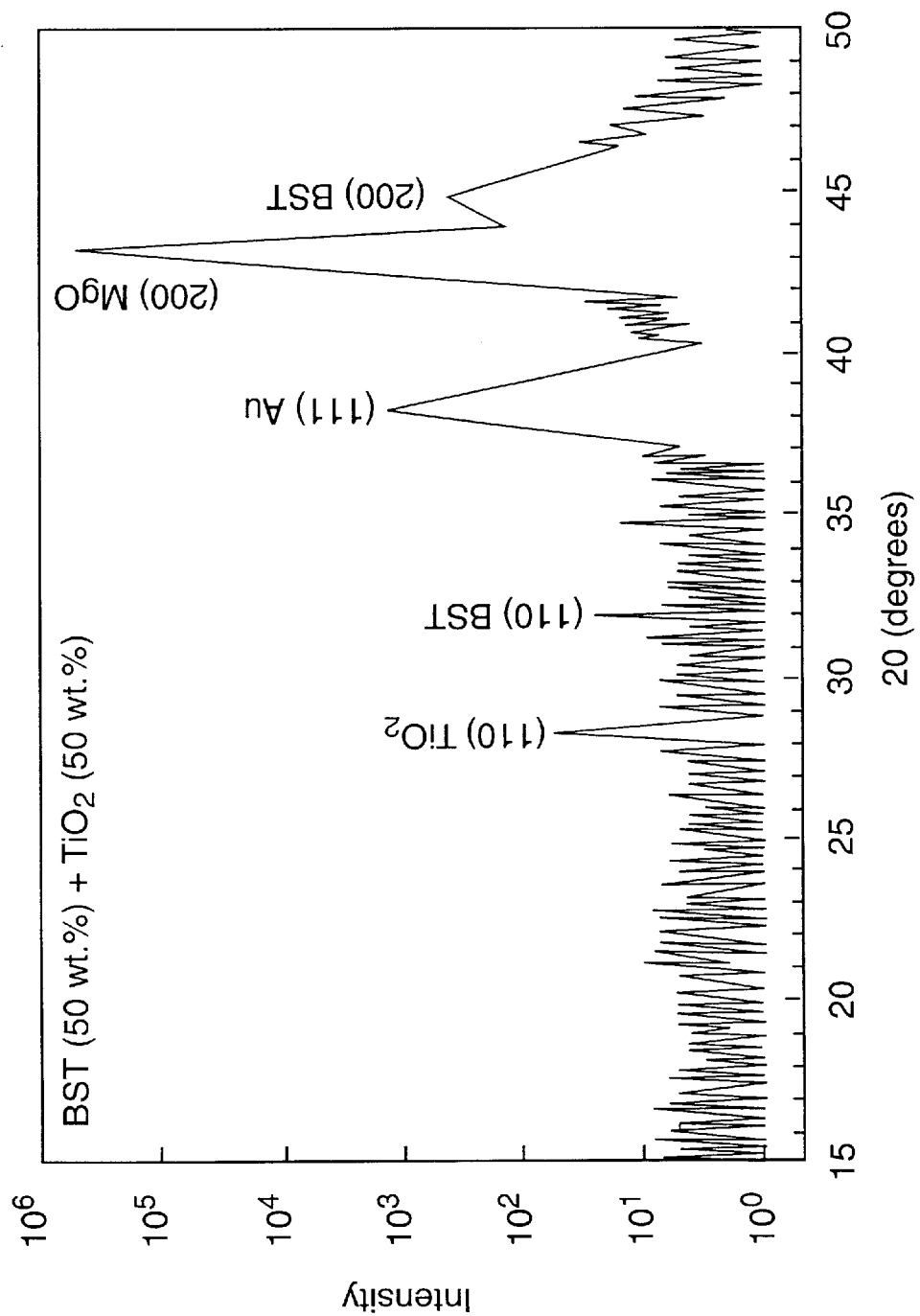
FIG. 2 is a graph plotting a X-ray diffraction scan of a 50 percent by weight BSTO/50 percent by weight $TiO_2$ composite on a MgO substrate in accordance with an embodiment of the present invention.

Composite $Ba_{0.6}Sr_{0.4}TiO_3/TiO_2$ (90/10 weight percent) and $Ba_{0.6}Sr_{0.4}TiO_3/TiO_2$ (50/50 weight percent) thin films have been deposited on magnesium oxide substrates by pulsed laser deposition. X-ray diffraction, transmission electron microscopy (TEM), and dielectric measurements have been used to characterize the films. Both x-ray diffraction and TEM studies have shown that the thin film composites had inclusions of $TiO_2$. FIG. 1 shows the x-ray diffraction pattern of a $Ba_{0.6}Sr_{0.4}TiO_3/TiO_2$ (90/10 weight percent) film. FIG. 2 shows the x-ray diffraction pattern of a $Ba_{0.6}Sr_{0.4}TiO_3/TiO_2$ (50/50 weight percent) film. As can be seen from FIGS. 1 and 2, both films clearly exhibited a $TiO_2$ phase. Visual evidence from the TEM supports this conclusion as well.

Dielectric measurements showed obvious reduction of dielectric loss of the composites. The maximum dielectric losses are 0.001 and 0.006 at 1 MHz for $Ba_{0.6}Sr_{0.4}TiO_3/TiO_2$ (90/10 weight percent) and $Ba_{0.6}Sr_{0.4}TiO_3/TiO_2$ (50/50 weight percent), respectively, compared to a value of 0.02 for pure $Ba_{0.6}Sr_{0.4}TiO_3$. The dielectric tunability is related to the percentage addition of $TiO_2$. For example, $Ba_{0.6}Sr_{0.4}TiO_3/TiO_2$ (50/50 weight percent) composite films showed no detectable tunability at a field up to 200 KV/cm but 37% for $Ba_{0.6}Sr_{0.4}TiO_3/TiO_2$ (90/10 weight percent) films.

As mentioned above, the existing approaches suffer from the significant reduction of the dielectric constant and the dielectric tunability. The present invention shows much improved material performance. The dielectric constant of $TiO_2$ is around 100. Its dielectric loss is around $10^{-4}$. The addition of $TiO_2$ into $Ba_{1-x}Sr_xTiO_3$ does not reduce the dielectric constant of the composite nearly as much as when alternative oxides are used as the dopant. The real advantages are that by controlling the amount of $TiO_2$ added to the $Ba_{1-x}Sr_xTiO_3$ not only can the dielectric constant and the tunability be adjusted but the dielectric loss of the composite can be reduced.

The composite materials of the present invention will find many uses in microelectronic applications in the radio frequency and microwave frequency regimes. The composite materials can be used as dielectric media for high performance thin film capacitors. More importantly, they can be used for electrically tunable microwave components such as filters and phase shifters that are important in defense electronics and civilian telecommunications.

The present invention is more particularly described in the following examples which are intended as illustrative only, since numerous modifications and variations will be apparent to those skilled in the art.

EXAMPLE 1

The microstructure of $TiO_2$ and $Ba_{1-x}Sr_xTiO_3$ composite thin films on MgO substrates was examined by transmission electron microscopy (TEM) and high resolution electron microscopy (HREM) in cross-section in the [100] direction. Cross-sectional TEM micrographs of the $TiO_2$ and $Ba_{1-x}Sr_xTiO_3$ composite thin films on MgO substrates revealed the following. Two distinct phases, one of $TiO_2$ and one of $Ba_{1-x}Sr_xTiO_3$ were observed.

Figure 3:
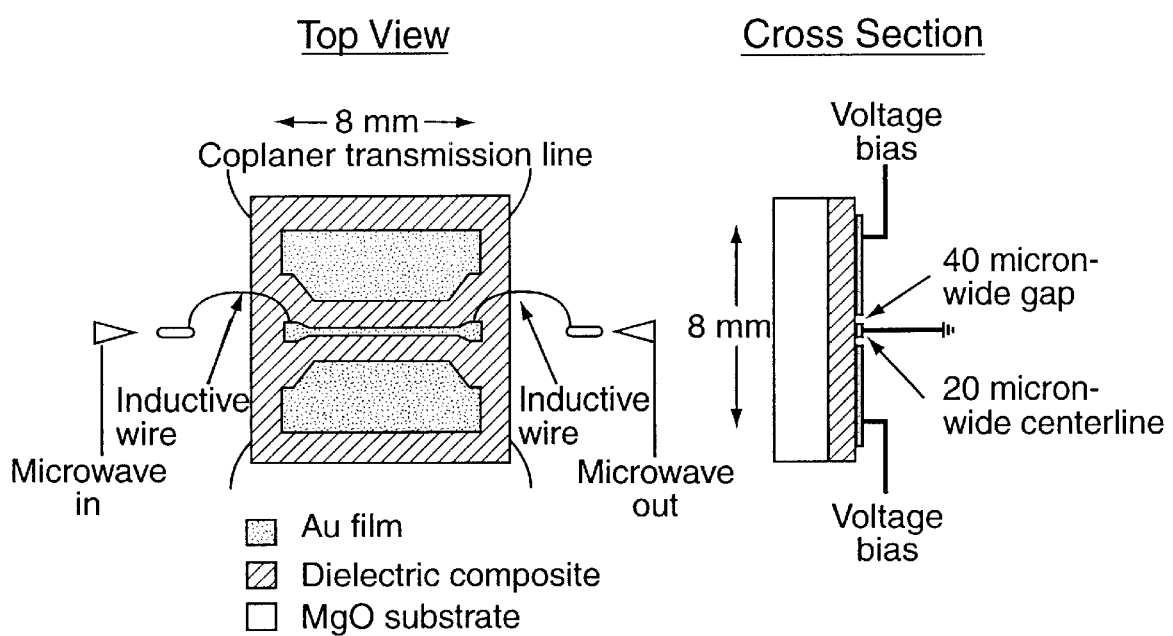
FIG. 3 shows a coplanar waveguide structure as constructed in the present invention.
Figure 4:
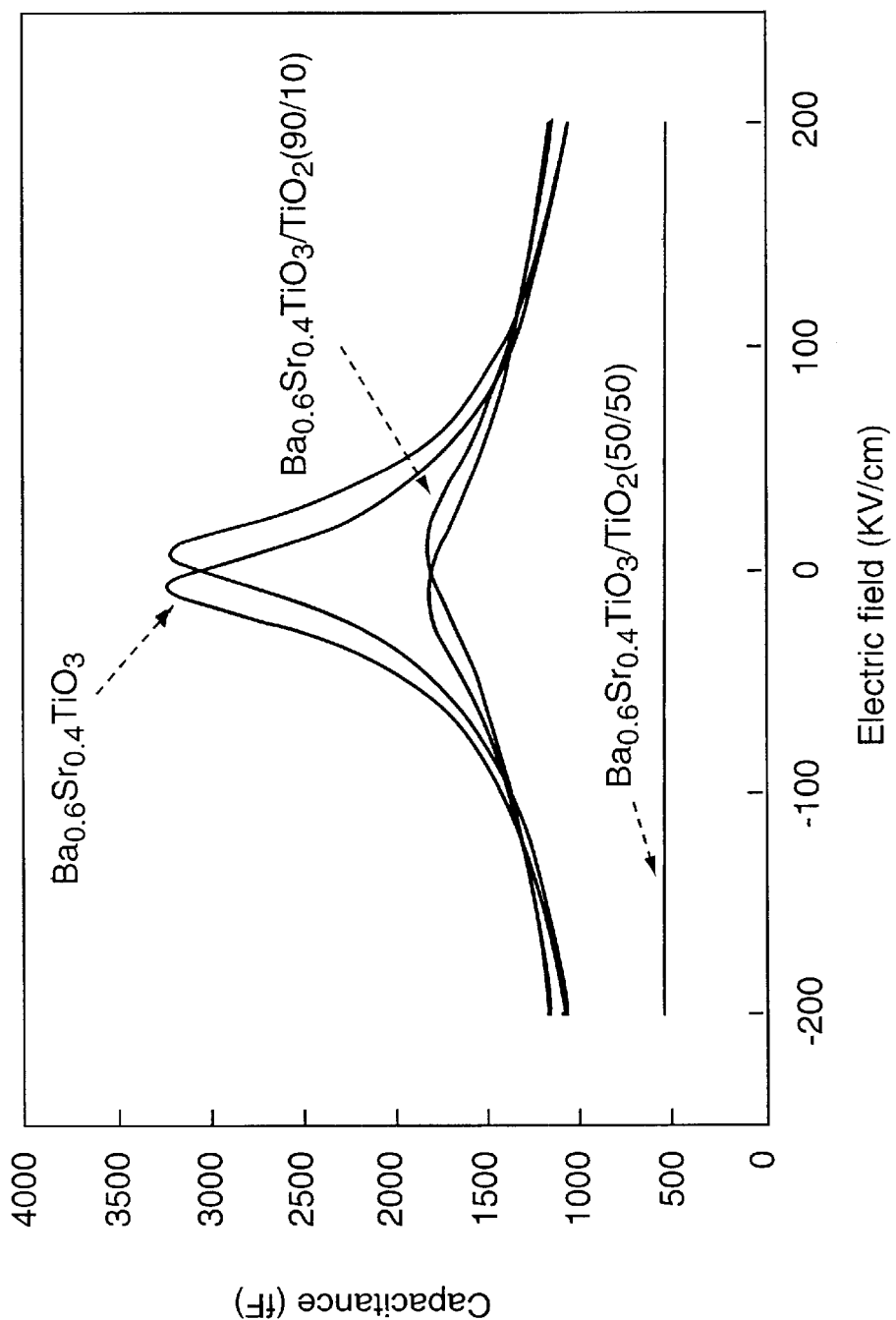
FIG. 4 is a graph plotting capacitance (femtoFarads (fF)) versus electric field for a 100 percent BSTO sample, a 90 percent by weight BSTO/10 percent by weight $TiO_2$ composite sample, and a 50 percent by weight BSTO/50 percent by weight $TiO_2$ composite sample.
Figure 5:
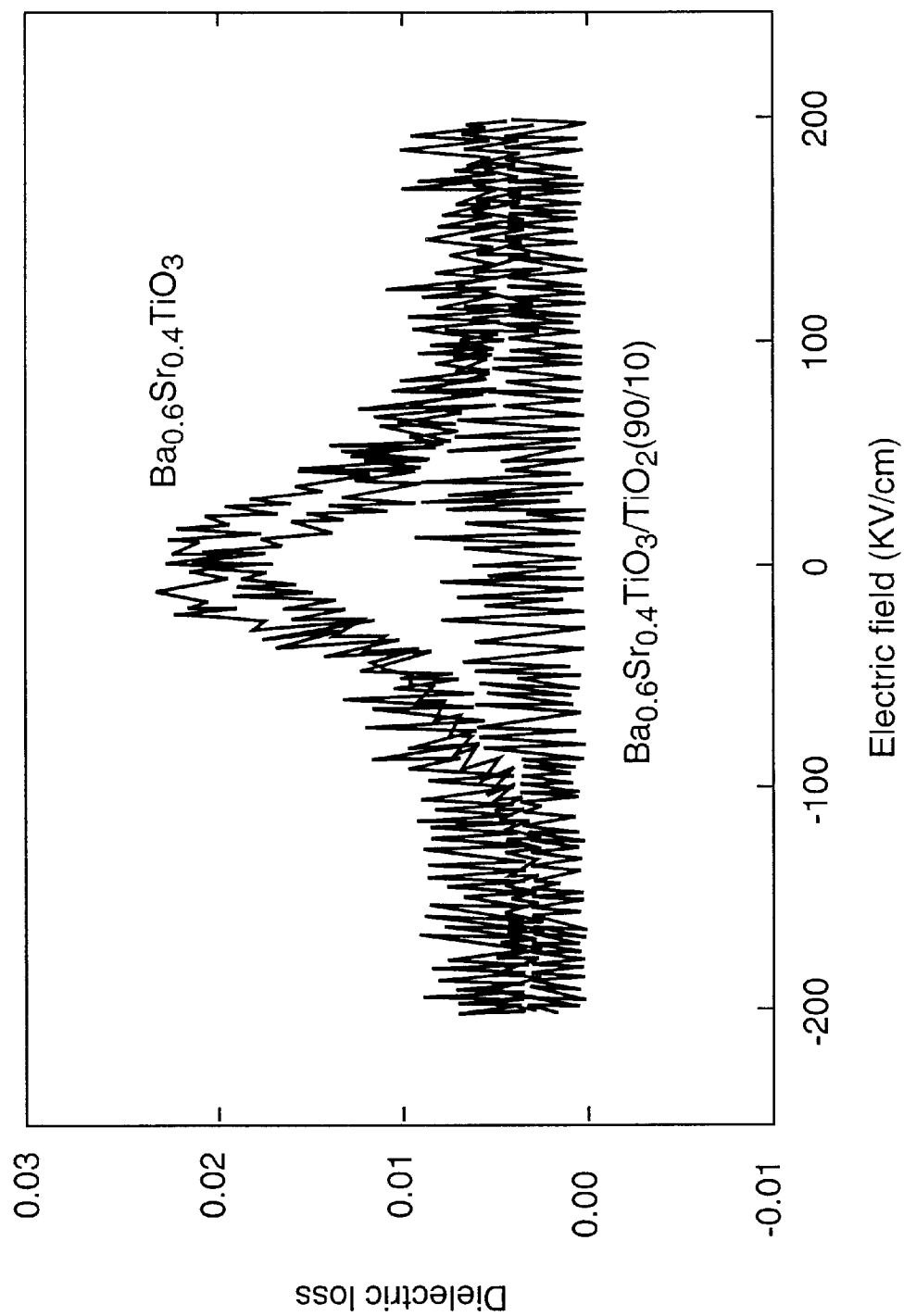
FIG. 5 is a graph plotting dielectric loss versus electric field for a 100 percent BSTO sample and a 90 percent by weight BSTO/10 percent by weight $TiO_2$ composite sample.

To assess the microwave losses of the epitaxial $TiO_2$ and $Ba_{1-x}Sr_xTiO_3$ composite thin films on MgO substrates, a coplanar waveguide structure as shown in FIG. 3 was fabricated incorporating a 2000 Å thick composite thin film of $TiO_2$ and $Ba_{1-x}Sr_xTiO_3$. Compositions including weight percentages of $BST/TiO_2$ of 50/50, 90/10, 95/5, 99/1 and 100/0 were measured. Gold contact pads (0.2 micron thick) were deposited by rf sputtering and patterned by a lift-off technique. The finished devices were annealed at 450° C. in oxygen. The device had a centerline width of 20 microns and a gap width of 40 microns between the centerline and the groundplates. The device was designed and operated in the manner of the electrically tunable coplanar transmission line resonator as described by Findikoglu et al., Appl. Phys. Lett., vol. 66, pp. 3674–3676 (1995), wherein YBCO/STO bilayers were grown directly on [001] $LaAlO_3$ substrates, such details incorporated herein by reference.

The structural properties of the films were characterized by x-ray diffraction measurements using a Siemens D5000 four circle diffractometer with Cu Kα radiation. In FIG. 1 is shown the XRD data from the sample including BST to $TiO_2$ or 90/10. Diffraction lines of both $TiO_2$ and $Ba_{1-x}Sr_xTiO_3$ phases are present.

The following table shows the measured dielectric properties of the $Ba_{0.6}Sr_{0.4}TiO_3/TiO_2$ composite films with different weight percentages of BSTO and $TiO_2$. The tunability is defined as [C(0V)–C(V)]/C(0V). The electric field was 200 kV/cm. The frequency was 1 MHz. The dielectric losses outlined in the table are the maximum values. The K factor is defined as tunability/loss. The commonly used figure of merit for the quality of frequency and phase agile materials is the ratio of the tunability to the loss, the so-called K factor.

| $BSTO/TiO_2$ (weight %) | 50/50 | 90/10 | 95/5 | 99/1 | 100/0 |
| --- | --- | --- | --- | --- | --- |
| Dielectric Constant | 120 | 428 | 1050 | 1100 | 1180 |
| Tunability (%) | 0 | 37 | 60 | 64 | 70 |
| Dielectric Loss | 0.001 | 0.006 | 0.02 | 0.02 | 0.02 |
| K | 0 | 62 | 30 | 32 | 35 |

The present results demonstrate that selected $BSTO/TiO_2$ composites can be characterized as tunable dielectric materials. For example, the $BSTO/TiO_2$ composite having weight percentages of about 90/10 had high tunability within the tested voltage range with a high K value and low dielectric loss.

EXAMPLE 2

A thin film of $BSTO/TiO_2$ of 50/50 weight percent was formed on a MgO substrate as in Example 1. At a high frequency of about 2.2 GHz, the resultant material was found to be non-tunable dielectric material within the tested voltage range and had a dielectric loss of less than 0.001, a value consistent with the low frequency measurement of Example 1. Applications for such a material include use as a capacitor in high frequency applications.

Although the present invention has been described with reference to specific details, it is not intended that such details should be regarded as limitations upon the scope of the invention, except as and to the extent that they are included in the accompanying claims.

What is claimed is:

1. A dielectric composite material comprising at least two crystal phases of different components with $TiO_2$ as a first component and a material selected from the group consisting of $Ba_{1-x}Sr_xTiO_3$ where x is from 0.3 to 0.7, $Pb_{1-x}Ca_xTiO_3$ where x is from 0.4 to 0.7, $Sr_{1-x}Pb_xTiO_3$ where x is from 0.2 to 0.4, $Ba_{1-x}Cd_xTiO_3$ where x is from 0.02 to 0.1, $BaTi_{1-x}Zr_xO_3$ where x is from 0.2 to 0.3, $BaTi_{1-x}Sn_xO_3$ where x is from 0.15 to 0.3, $BaTi_{1-x}Hf_xO_3$ where x is from 0.24 to 0.3, $Pb_{1-1.3x}La_xTiO_{3+0.2x}$ where x is from 0.23 to 0.3, $(BaTiO_3)_x(PbFe_{0.5}Nb_{0.5}O_3)_{1-x}$ where x is from 0.75 to 0.9, $(PbTiO_3)_x(PbCo_{0.5}W_{0.5}O_3)_{1-x}$ where x is from 0.1 to 0.45, $(PbTiO_3)_x(PbMg_{0.5}W_{0.5}O_3)_{1-x}$ where x is from 0.2 to 0.4, and $(PbTiO_3)_x(PbFe_{0.5}Ta_{0.5}O_3)_{1-x}$ where x is from 0 to 0.2, as the second component.

2. The dielectric composite material of claim 1 wherein said dielectric composite material is a thin film and is characterized as epitaxial upon a substrate selected from the group consisting of lanthanum aluminum oxide, magnesium oxide, and neodymium gadolinium oxide.

3. The dielectric composite material of claim 1 wherein said dielectric composite material is a thin film and is characterized as amorphous, polycrystalline or nanocrystalline upon a substrate selected from the group consisting of semiconductors, insulators, metals and metal alloys.

4. The dielectric composite material of claim 3 wherein said substrate is selected from the group consisting of silicon, sapphire and steel.

5. The dielectric composite material of claim 1 wherein said dielectric composite material includes from about 45 percent by weight to about 55 percent by weight of $TiO_2$ and from about 45 percent by weight to about 55 percent by weight of $Ba_{1-x}Sr_xTiO_3$.

6. The dielectric composite material of claim 1 wherein said dielectric composite material includes from about 7 percent by weight to about 40 percent by weight of $TiO_2$ and from about 60 percent by weight to about 93 percent by weight of $Ba_{1-x}Sr_xTiO_3$ and said dielectric composite material is characterized as a tunable dielectric material.

7. The dielectric composite material of claim 1 wherein said dielectric composite material includes about 10 percent by weight of $TiO_2$ and about 90 percent by weight of $Ba_{1-x}Sr_xTiO_3$ and said dielectric composite material is characterized as a tunable dielectric material.

8. The dielectric composite material of claim 1 wherein said dielectric composite material includes about 50 percent by weight of $TiO_2$ and about 50 percent by weight of $Ba_{1-x}Sr_xTiO_3$ and said dielectric composite material is characterized as having a dielectric loss of 0.001 or less.

9. A dielectric composite material comprising at least two crystal phases of different components, formed at high temperatures from $TiO_2$ and a material selected from the group consisting of $Ba_{1-x}Sr_xTiO_3$ where x is from 0.3 to 0.7, $Pb_{1-x}Ca_xTiO_3$ where x is from 0.4 to 0.7, $Sr_{1-x}Pb_xTiO_3$ where x is from 0.2 to 0.4, $Ba_{1-x}Cd_xTiO_3$ where x is from 0.02 to 0.1, $BaTi_{1-x}Zr_xO_3$ where x is from 0.2 to 0.3, $BaTi_{1-x}Sn_xO_3$ where x is from 0.15 to 0.3, $BaTi_{1-x}Hf_xO_3$ where x is from 0.24 to 0.3, $Pb_{1-1.3x}La_xTiO_{3+0.2x}$ wherei x is from 0.23 to 0.3, $(BaTiO_3)_x(PbFe_{0.5}Nb_{0.5}O_3)_{1-x}$ where x is from 0.75 to 0.9, $(PbTiO_3)_x(PbCo_{0.5}W_{0.5}O_3)_{1-x}$ where x is from 0.1 to 0.45, $(PbTiO_3)_x(PbMg_{0.5}W_{0.5}O_3)_{1-x}$ where x is from 0.2 to 0.4, and $(PbTiO_3)_x(PbFe_{0.5}Ta_{0.5}O_3)_{1-x}$ where x is from 0 to 0.2.

10. The dielectric composite material of claim 9 wherein said dielectric composite material is a thin film and is characterized as epitaxial upon a substrate selected from the group consisting of lanthanum aluminum oxide, magnesium oxide, and neodymium gadolinium oxide.

11. The dielectric composite material of claim 9 wherein said dielectric composite material is a thin film and is characterized as amorphous, polycrystalline or nanocrystalline upon a substrate selected from the group consisting of semiconductors, insulators, metals and metal alloys.

12. The dielectric composite material of claim 11 wherein said substrate is selected from the group consisting of silicon, sapphire and steel.

13. The dielectric composite material of claim 9 wherein said dielectric composite material includes from about 45 percent by weight to about 55 percent by weight of $TiO_2$ and from about 45 percent by weight to about 55 percent by weight of $Ba_{1-x}Sr_xTiO_3$.

14. The dielectric composite material of claim 9 wherein said dielectric composite material includes from about 7 percent by weight to about 40 percent by weight of $TiO_2$ and from about 60 percent by weight to about 93 percent by weight of $Ba_{1-x}Sr_xTiO_3$ and said dielectric composite material is characterized as a tunable dielectric material.

15. The dielectric composite material of claim 9 wherein said dielectric composite material includes about 10 percent by weight of $TiO_2$ and about 90 percent by weight of $Ba_{1-x}Sr_xTiO_3$ and said dielectric composite material is characterized as a tunable dielectric material.

16. The dielectric composite material of claim 9 wherein said dielectric composite material includes about 50 percent by weight of $TiO_2$ and about 50 percent by weight of $Ba_{1-x}Sr_xTiO_3$ and said dielectric composite material is characterized as having a dielectric loss of 0.001 or less.

17. A process of forming a thin film dielectric composite material including at least two crystal phases of different components with $TiO_2$ as a first component and a material selected from the group consisting of $Ba_{1-x}Sr_xTiO_3$ where x is from 0.3 to 0.7, $Pb_{1-x}Ca_xTiO_3$ where x is from 0.4 to 0.7, $Sr_{1-x}Pb_xTiO_3$ where x is from 0.2 to 0.4, $Ba_{1-x}Cd_xTiO_3$ where x is from 0.02 to 0.1, $BaTi_{1-x}Zr_xO_3$ where x is from 0.2 to 0.3, $BaTi_{1-x}Sn_xO_3$ where x is from 0.15 to 0.3, $BaTi_{1-x}Hf_xO_3$ where x is from 0.24 to 0.3, $Pb_{1-1.3x}La_xTiO_{3+0.2x}$ where x is from 0.23 to 0.3, $(BaTiO_3)_x(PbFe_{0.5}Nb_{0.5}O_3)_{1-x}$ where x is from 0.75 to 0.9, $(PbTiO_3)_x(PbCo_{0.5}W_{0.5}O_3)_{1-x}$ where x is from 0.1 to 0.45, $(PbTiO_3)_x(PbMg_{0.5}W_{0.5}O_3)_{1-x}$ where x is from 0.2 to 0.4, and $(PbTiO_3)_x(PbFe_{0.5}Ta_{0.5}O_3)_{1-x}$ where x is from 0 to 0.2, as the second component comprising:

forming a starting material including a mixture of $TiO_2$ and the material selected from the group consisting of $Ba_{1-x}Sr_xTiO_3$, $Pb_{1-x}Ca_xTiO_3$, $Sr_{1-x}Pb_xTiO_3$, $Ba_{1-x}Cd_xTiO_3$, $BaTi_{1-x}Zr_xO_3$, $BaTi_{1-x}Sn_xO_3$, $BaTi_{1-x}Hf_xO_3$, $Pb_{1-1.3x}La_xTiO_{3+0.2x}$, $(BaTiO_3)_x(PbFe_{0.5}Nb_{0.5}O_3)_{1-x}$, $(PbTiO_3)_x(PbCo_{0.5}W_{0.5}O_3)_{1-x}$, $(PbTiO_3)_x(PbMg_{0.5}W_{0.5}O_3)_{1-x}$, and $(PbTiO_3)_x(PbFe_{0.5}Ta0.5O_3)_{1-x}$;

depositing a thin film of the starting material on a substrate; and, heating the thin film of starting material for time and at temperatures sufficient to form said thin film dielectric composite material including at least two crystal phases of different components.

18. The process of claim 17 wherein said substrate is selected from the group consisting of lanthanum aluminum oxide, magnesium oxide, and neodymium gadolinium oxide.

19. The process of claim 17 wherein said substrate is selected from the group consisting of semiconductors, insulators, metals and metal alloys.

20. The process of claim 17 wherein said substrate is selected from the group consisting of silicon, sapphire and steel.

* * * * *